(12) United States Patent
Stoll

(10) Patent No.: US 10,031,874 B2
(45) Date of Patent: Jul. 24, 2018

(54) UNIVERSAL INPUT/OUTPUT CIRCUIT

(71) Applicant: Siemens Schweiz AG, Zurich (CH)

(72) Inventor: Walter Stoll, Sattel (CH)

(73) Assignee: SIEMENS SCHWEIZ AG, Zurich (CH)

( * ) Notice: Subject to any disclaimer, the term of this patent is extended or adjusted under 35 U.S.C. 154(b) by 116 days.

(21) Appl. No.: 15/200,968

(22) Filed: Jul. 1, 2016

(65) Prior Publication Data
US 2017/0010994 A1   Jan. 12, 2017

(30) Foreign Application Priority Data
Jul. 8, 2015  (EP) .................................... 15175814

(51) Int. Cl.
| | |
|---|---|
| H03M 1/66 | (2006.01) |
| H03M 1/12 | (2006.01) |
| G06F 13/38 | (2006.01) |
| G05B 19/042 | (2006.01) |

(Continued)

(52) U.S. Cl.
CPC ....... *G06F 13/387* (2013.01); *G05B 19/0423* (2013.01); *G06F 13/4022* (2013.01); *G06F 13/4282* (2013.01); *H03M 1/12* (2013.01); *H03M 1/66* (2013.01); *G05B 2219/21114* (2013.01); *G05B 2219/21115* (2013.01);
(Continued)

(58) Field of Classification Search
CPC .. H03M 1/12; H03M 1/66; G05B 2219/21114
See application file for complete search history.

(56) References Cited

U.S. PATENT DOCUMENTS

| | | | |
|---|---|---|---|
| 7,271,752 B2* | 9/2007 | Stoll ....................... | H04L 25/45 341/126 |
| 2007/0167143 A1* | 7/2007 | Okada ...................... | H03J 3/08 455/250.1 |

(Continued)

FOREIGN PATENT DOCUMENTS

EP   1500992 B1   11/2005   ........... G05B 19/042

OTHER PUBLICATIONS

European Search Report, Application No. 15175814.1, 7 pages, dated Jan. 14, 2016.

*Primary Examiner* — Farley Abad
(74) *Attorney, Agent, or Firm* — Slayden Grubert Beard PLLC

(57) ABSTRACT

A universal input/output circuit for building automation is provided that may avoid issues related to capacitor soakage, thereby giving more accurate measurements of electric resistance. To mitigate capacitor soakage, the voltage between the input/output terminals is held constant. A programmable source drives a current through a resistor that connects to the input/output terminals. The circuit then measures a value of electrical resistance. The measurement yields a voltage signal which is transferred from the input of an analog-to-digital converter to the input of a digital-to-analog converter. A unity gain amplifier applies the output voltage of the digital-to-analog converter D/A to one of terminals. The circuit is configured such that the voltage signal at the output of the amplifier matches or substantially matches the voltage obtained from the resistance measurement.

16 Claims, 3 Drawing Sheets

(51) Int. Cl.
   *G06F 13/40*     (2006.01)
   *G06F 13/42*     (2006.01)

(52) U.S. Cl.
   CPC .............. *G05B 2219/21119* (2013.01); *G05B 2219/21137* (2013.01)

(56) References Cited

U.S. PATENT DOCUMENTS

2011/0071794 A1   3/2011   Bronczyk et al. ............ 702/188
2014/0047137 A1   2/2014   Mathason et al. .............. 710/33

* cited by examiner

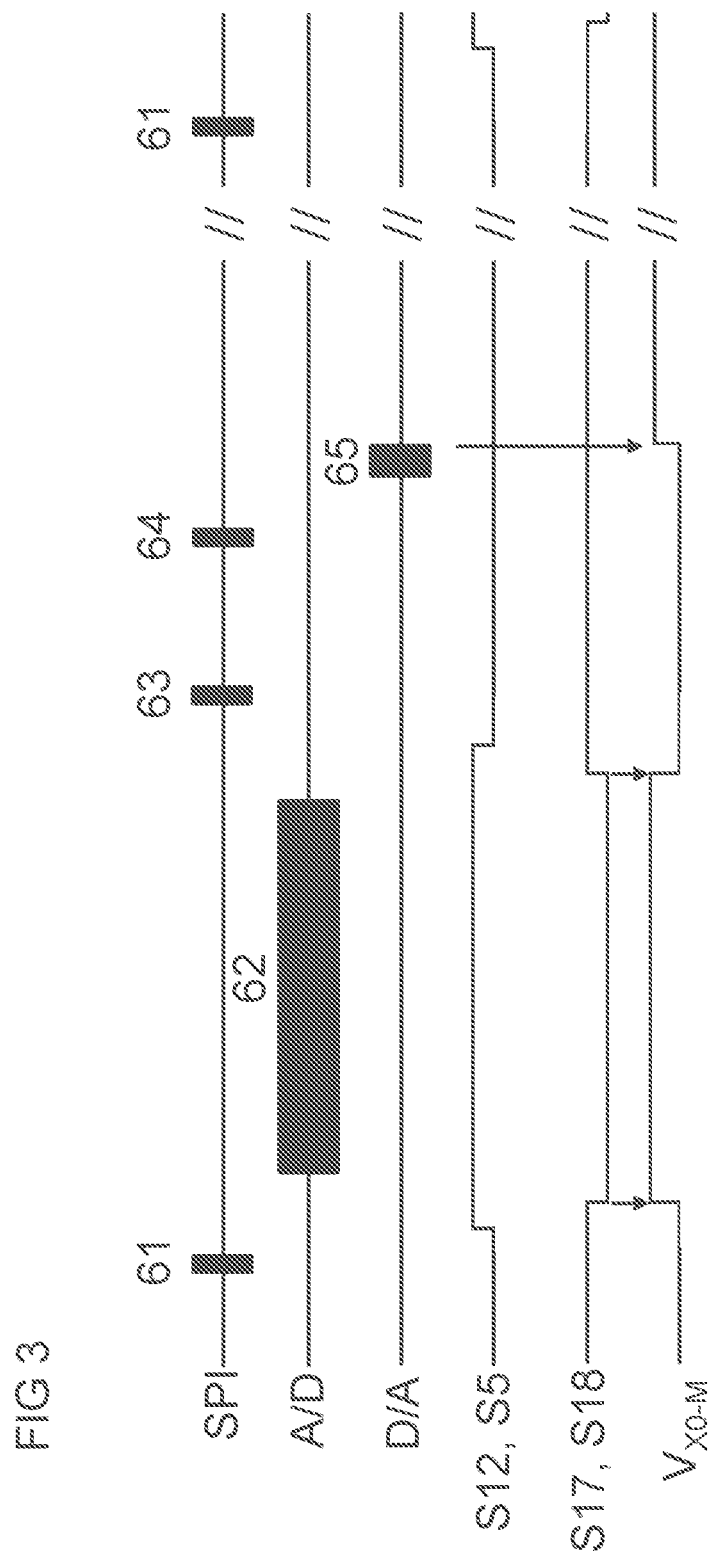

UNIVERSAL INPUT/OUTPUT CIRCUIT

CROSS-REFERENCE TO RELATED APPLICATIONS

This application claims priority to EP Application No. 15175814.1 filed Jul. 8, 2015, the contents of which are hereby incorporated by reference in their entirety.

TECHNICAL FIELD

The present disclosure relates to a universal input/output circuit. More particularly, the present disclosure focuses on an input/output circuit to be used in building automation. The instant disclosure also relates to a building automation system with a universal input/output circuit.

BACKGROUND

Circuits for the detection of analog and of digital signals typically involve an analog-to-digital (A/D) converter. An A/D converter changes an analog signal into a digital value. A/D converters are commonly employed to change a signal from a light sensor or from a temperature-dependent resistor into a digital signal. The digital signal can then be processed by a microprocessor.

Circuits supplying an actuator are frequently based on a digital-to-analog (D/A) converter. A digital-to-analog converter changes a digital value into an analog signal. The D/A converter commonly provides a signal and sets the position of an actuator.

The output module of a universal input/output circuit typically involves an amplifier. An amplifier is required because the impedance at the output of the D/A converter does not match the impedance at the input of the actuator. The amplifier preferably is a unity gain amplifier which amplifies an electric current without changing voltage.

The patent EP1500992B1 issued on 9 Nov. 2005 and discloses an apparatus for operating field devices of a building automation system. Field devices of building automation systems are, by way of non-limiting example, temperature sensors, humidity probes, light sensors, actuators for blinds, valve actuators etc. The apparatus of EP1500992B1 provides a universal input/output circuit that connects to various field devices.

The universal input/output circuit of EP1500992B1 includes an A/D converter to carry out measurements of temperature, humidity, air quality etc. An additional D/A converter sets the position of an actuating device in accordance with a voltage signal. A unity gain amplifier matches the output impedance of the D/A converter to the impedance of the actuator. The input/output circuit of EP1500992B1 also provides a number of switches. These switches allow for reconfiguration of the circuit such that the same universal input/output circuit can be used for reading sensors and also for driving actuators.

To minimize the number of components, the circuit sequentially obtains readings. That is, the apparatus may simultaneously connect to multiple sensors such as light sensors and thermocouples. A time frame is allocated to each sensor and the input/output circuit takes measurements from the sensors in accordance with allocated time frames. An input/output circuit adapted for sequential readings dispenses with separate A/D converters for every sensor.

Resistance measurements of field devices are generally prone to dielectric absorption. Those issues are due to the different time constants of molecular relaxation of the charge carriers on a capacitor. They may arise whenever a capacitive element is in parallel with a (resistive) sensor. An electric charge remaining on a capacitor will thus impair the resistance measurement. The parallel resistance may actually be a stray capacitance and may be caused by leads that connect to a field device.

SUMMARY

One embodiment provides a circuit arrangement for universal input/output having at least one interface module having an analog-to-digital converter with an input channel and with an output port, a digital-to-analog converter with an input port and with an output channel, a first connection point, an amplifier with a non-inverting input channel, and a switching network with a plurality of switches, wherein the output channel of the digital-to-analog converter connects either directly or via a sample-and-hold element to the non-inverting input channel of the amplifier, wherein the switching network is configured to connect the analog-to-digital converter either directly or via a program-controlled scaling apparatus to the first connection point, wherein upon connection of the analog-to-digital converter to the first connection point the analog-to-digital converter is configured to convert a first analog voltage at the first connection point into a digital representation of said first analog voltage and to output said digital representation at its output port, wherein the circuit arrangement is configured to transfer said digital representation from the output port of the analog-to-digital converter to the input port of the digital-to-analog converter, wherein to facilitate said transfer the circuit arrangement provides a bus connecting the output port of the analog-to-digital converter to the input port of the digital-to-analog converter and/or the circuit arrangement provides a register configured to be written by the analog-to-digital converter and configured to be read by the digital-to-analog converter, and wherein upon completion of said transfer the digital-to-analog converter is configured to convert said digital representation at its input port into a second analog voltage, such that said second analog voltage is the same or substantially the same as said first analog voltage.

In one embodiment, the circuit arrangement provides the register configured to be written by the analog-to-digital converter and configured to be read by the digital-to-analog converter and wherein said register is part of the interface module.

In one embodiment, the register is part of the analog-to-digital converter and wherein the input port of the digital-to-analog converter connects to the register of the analog-to-digital converter such that the digital-to-analog converter can read said digital representation from said register.

In one embodiment, the register is part of the digital-to-analog converter and wherein the output port of the analog-to-digital converter connects to the register of the digital-to-analog converter such that the analog-to-digital converter can write said digital representation to said register.

In one embodiment, the circuit arrangement provides a bus connecting the output port of the analog-to-digital converter to the input port of the digital-to-analog converter and wherein said bus is part of the interface module.

In one embodiment, the bus is configured to establish a unidirectional data connection from the output port of the analog-to-digital converter to the input port of the digital-to-analog converter.

In one embodiment, the bus is configured to establish a bidirectional data connection between the output port of the analog-to-digital converter and the input port of the digital-to-analog converter.

In one embodiment, the circuit arrangement provides a microcomputer configured to instruct the switching network to carry out switching operations and/or configured to instruct the analog-to-digital converter to carry out conversion operations and/or configured to instruct the digital-to-analog-converter to carry out conversion operations and/or configured to instruct the analog-to-digital converter to write to a register and/or configured to instruct the digital-to-analog-converter to read from a register and/or configured to instruct a current source.

In one embodiment, the interface module additionally comprises a serial-peripheral interface and wherein the microcomputer is configured to instruct the switching network via the serial-peripheral interface and/or is configured to instruct the analog-to-digital converter via the serial-peripheral interface and/or is configured to instruct the digital-to-analog-converter via the serial-peripheral interface and/or is configured to instruct the analog-to-digital converter via the serial-peripheral interface and/or is configured to instruct a current source via the serial-peripheral interface.

In one embodiment, the circuit arrangement additionally comprises a first resistor and a second resistor, and wherein the interface module comprises a second connection point and wherein the amplifier comprises an inverting input channel and an output channel, and wherein the switching network is configured to connect the inverting input channel of the amplifier to the first connection point, and wherein the switching network is configured to connect the output channel of the amplifier to the second connection point, and wherein the first resistor and the second resistor in series electrically connect the second connection point to the first connection point, such that the output channel of the amplifier can be led to the inverting input channel of the amplifier via the second connection point and via the second resistor and via the first resistor and via the first connection point.

In one embodiment, the switching network and the first resistor and the second resistor are configured to lead the output channel of the amplifier to the inverting input channel of the amplifier, such that the amplifier becomes a unity gain amplifier.

In one embodiment, the circuit arrangement comprises a first resistor and a second resistor and at least two terminals for connecting field devices, and wherein the interface module comprises a second connection point, wherein the terminal connects via the first resistor to the first connection point, and the terminal connects via a second resistor to the second connection point.

In one embodiment, at least one electric component connects between the at least two terminals of the circuit arrangement and wherein the at least one electric component includes at least one of the following: a capacitor and/or a surge arrester, and wherein the at least one element is either implemented in the interface module or outside the interface module.

In one embodiment, the circuit arrangement further provides a current source, and wherein the switching network is configured to connect the current source to the second connection point.

In one embodiment, at least one terminal is configured for use as a signal reference point.

BRIEF DESCRIPTION OF THE DRAWINGS

Example aspects and embodiments of the invention are described in detail below with reference to the drawings, in which:

FIG. 3 is a chart with a switch sequence applied to the universal input/output circuit.

DETAILED DESCRIPTION

Figure 1:
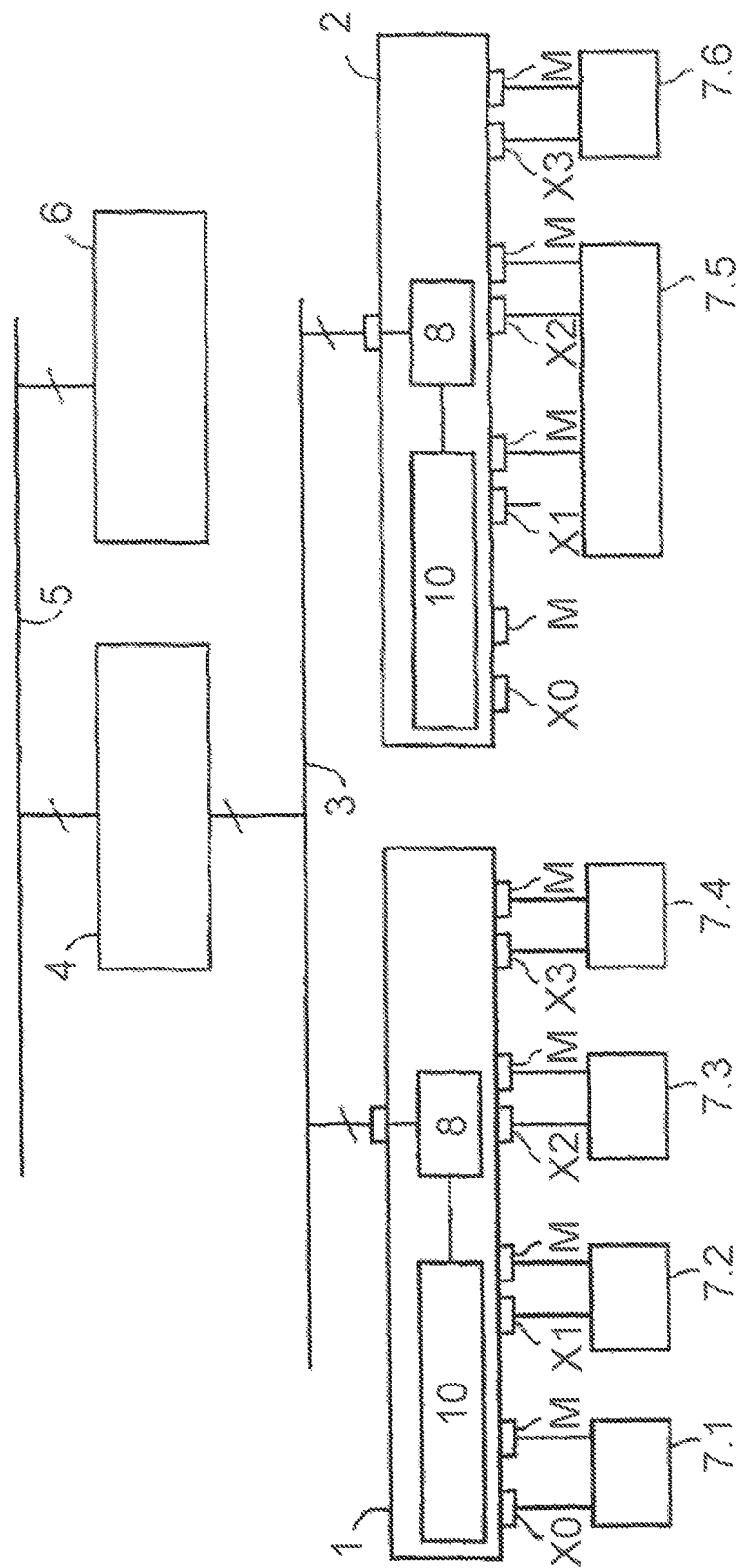
FIG. 1 is a block diagram of (a part of) a system with field devices.

Embodiments of the present invention may provide improved input/output circuits for building automation devices that may mitigate one or more of the aforementioned difficulties.

Some embodiments provide a universal input/output circuit that mitigates issues due to capacitor soakage. A universal input/output circuit according to the instant disclosure is typically part of a building automation system.

To avoid issues related to capacitor soakage, the universal input/output circuit first drives a known current through the resistance between the two terminals of the circuit. A resistance is determined by measurement of the voltage drop between the two terminals. The circuit is then reconfigured by actuation of at least one switch. Upon completion of the reconfiguration, the circuit is configured to output a voltage. The voltage between the two terminals of the circuit matches or substantially matches the voltage obtained from the previous measurements.

The voltage between the two terminals thus is the same or substantially the same before and after reconfiguration. Any adverse effects due to capacitor soakage are mitigated and/or eliminated by maintenance of a constant voltage.

In other words, the present disclosure teaches a circuit arrangement for universal input/output having at least one interface module having an analog-to-digital converter with an input channel and with an output port, a digital-to-analog converter with an input port and with an output channel, a first connection point an amplifier with a non-inverting input channel, and a switching network with a plurality of switches, wherein the output channel of the digital-to-analog converter connects either directly or via a sample-and-hold element to the non-inverting input channel of the amplifier, wherein the switching network is configured to connect the analog-to-digital converter either directly or via a program-controlled scaling apparatus to the first connection point, wherein upon connection of the analog-to-digital converter to the first connection point the analog-to-digital converter is configured to convert a first analog voltage at the first connection point into a digital representation of said first analog voltage and to output said digital representation at its output port, wherein the circuit arrangement is configured to transfer said digital representation from the output port of the analog-to-digital converter to the input port of the digital-to-analog converter, wherein to facilitate said transfer the circuit arrangement provides a bus connecting the output port of the analog-to-digital converter to the input port of the digital-to-analog converter and/or the circuit arrangement provides a register configured to be written by the analog-to-digital converter and configured to be read by the digital-to-analog converter, wherein upon completion of said transfer the digital-to-analog converter is configured to convert said digital representation at its input port into a second analog voltage, such that said first analog voltage is the same or substantially the same as said first analog voltage.

An object of some embodiments of the present disclosure is to reconfigure a universal input/output circuit and to maintain constant voltage between two terminals of a circuit, wherein reconfiguration involves two switches.

Another object of some embodiments of the present disclosure is to reconfigure a universal input/output circuit and to maintain constant voltage between two terminals of a circuit, wherein reconfiguration involves an operation of two switches and wherein the switching operations overlap.

Yet another object of some embodiments of the present disclosure is to reconfigure a universal input/output circuit and to maintain constant voltage between two terminals of a circuit, wherein reconfiguration of the circuit involves an A/D converter and/or a D/A converter.

Still another object of some embodiments of the present disclosure is to reconfigure a universal input/output circuit and to maintain constant voltage between two terminals of a circuit, wherein maintenance of constant voltage involves a unity gain amplifier, preferably involves a unity gain amplifier with an operational amplifier.

Some embodiments provide a universal input/output circuit, wherein at least one pair of terminals of the circuit involves protection from (transient) overvoltages.

The instant disclosure thus teaches the aforementioned circuit arrangement, wherein at least one electric component connects between the at least two terminals of the circuit arrangement and wherein the at least one electric component includes at least one of the following:

a capacitor and/or
a surge arrester and
wherein the at least one element is either implemented in the interface module or outside the interface module.

Some embodiments provide a universal input/output circuit, wherein the circuit is adapted to determine the resistances of positive temperature coefficient and/or negative coefficient elements.

Other embodiments provide a building automation system with a universal input/output circuit according to the instant disclosure.

In FIG. 1, reference numeral 1 stands for a first and reference numeral 2 stands for a second universal input/output circuit. The two input/output circuits 1 and 2 connect, by way of example, via a bus system 3 to a control and regulation device 4. The control and regulation device 4 typically connects via another bus system 5 to a superordinated module 6.

The universal input/output circuit 1 or else 2 serves to operate field devices. A field device generally is a sensor for recording a process variable such as temperature, humidity, air quality, light etc. The field device may also be a servo drive for influencing a process variable.

The input/output circuit 1 or else 2 provides several terminals X0, X1, X2, and X3 for the connection of field devices. The number of field devices able to be connected per input/output circuit 1 or else 2 can, in principle, be chosen within wide limits. The number of field devices able to connect per input/output circuit 1 or else 2 is generally chosen in accordance with a number of (conflicting) technical requirements. These include, but are not limited to, allowable costs, space requirements, expected data flow per unit of time etc. In building automation systems, four, eight, sixteen, thirty-two, or sixty-four connection points per input/output circuit 1 or else 2 are advantageously realized.

A connection point provides a terminal X0, X1, X2, or X3. Ideally, each connection point provides a further terminal M for the signal reference point. The terminals M for the signal reference point advantageously connect to each other inside the input/output circuit 1 or else 2.

In other words, the circuit arrangement of the instant disclosure provides at least one terminal M configured for use as a signal reference point.

In other words, the instant disclosure teaches a circuit arrangement, wherein at least one terminal M is configured to be used as a signal reference point.

It is also possible for the input/output circuit 1 or else 2 to provide a terminal as the signal reference point of all field devices.

The terminals X0, X1, X2, and X3 are preferably constructed and wired in the same way. They can typically be used universally as input ports and/or as output ports. They can thus be used for unidirectional and/or for bidirectional signal flow. The universal terminals X0, X1, X2, and X3 can be used both for analog signals and for digital signals. The universal terminals X0, X1, X2, or X3 may be used for various types of field devices. The universal terminals X0, X1, X2, or X3 are able to be used for sensors and/or for actuators, for field devices with analog input, with analog output, with digital input and/or with digital output. If required, a field device 7 connects to several terminals X0, X1, X2 or X3 at a time. A field device 7 typically connects to several terminals X0, X1, X2 or X3 when the field device 7 is a servo actuator with position reporting. An adjustment signal is then outputted at one terminal. A status and/or a current position is simultaneously read at a further terminal.

The universal terminals X1, X1, X2, and/or X3, and/or the further terminal M are advantageously realized as spring-type terminals. Evidently, the terminals X1, X1, X2 and/or X3 and/or the further terminal M can also be realized as screw-type terminals. According to yet another embodiment, the terminals X1, X1, X2, and/or X3, and/or the further terminal M are realized as plugs or plug elements.

The input/output circuits 1 or else 2 include at least one microcomputer 8 each and at least one interface component 10 each. The microcomputer 8 connects to the interface component 10. The microcomputer 8 allows the universal terminals X0, X1, X2, and/or X3 to be configured for a specific task and to operate accordingly. The input/output circuits 1 or else 2 advantageously connect via the microcomputer 8 to the bus system 3 for a data communication with the control and regulation device 4. In a variant of the input/output module 1 or else 2, the microcomputer 8 is implemented in the interface component 10. In accordance with the instant disclosure, the interface component provides external circuitry. The external circuitry is advantageously provided in the corresponding input/output circuit 1 or else 2. The external circuitry is preferably provided on a printed circuit board.

In other words, the circuit arrangement of the instant disclosure provides a microcomputer 8 configured to instruct the switching network Sxx, Tx to carry out switching operations and/or configured to instruct the analog-to-digital converter A/D to carry out conversion operations and/or configured to instruct the digital-to-analog-converter D/A to carry out conversion operations and/or configured to instruct the analog-to-digital converter A/D to write to a register and/or configured to instruct the digital-to-analog-converter D/A to read from a register and/or configured to instruct a current source 25.

In a particular embodiment, the circuit arrangement of the instant disclosure provides an interface module wherein the interface module 10 additionally comprises a serial-peripheral interface SPI and wherein the microcomputer 8 is configured to instruct the switching network Sxx, Tx via the serial-peripheral interface SPI and/or is configured to instruct the analog-to-digital converter A/D via the serial-peripheral interface SPI and/or is configured to instruct the digital-to-analog-converter D/A via the serial-peripheral interface SPI and/or is configured to instruct the analog-to-digital converter A/D via the serial-peripheral interface SPI and/or is configured to instruct a current source via the serial-peripheral interface SPI.

The interface component 10 or parts of the interface component are advantageously realized as a so-called application specific integrated circuit (ASIC). The use of an application specific integrated circuit allows for production of large numbers of items at favorable cost. Also high reliability and/or operational safety are achieved by using application specific integrated circuits. The microcontroller 8 can, by way of non-limiting example, be a Freescale® MPC8xx, Texas Instruments® AM335x, Renesas® V850, Freescale® S08, or any other suitable architecture. The microcontroller 8 can, by way of non-limiting example, be procured off-the-shelf. The universal terminals connect, by way of non-limiting example, to a passive sensor 7.1, to an active sensor 7.2, to a potential-free switch 7.3, to a voltage-controlled servo element 7.4, to a current-controlled servo element 7.5 with a position reporter, and to a further field device 7.6.

Figure 2:
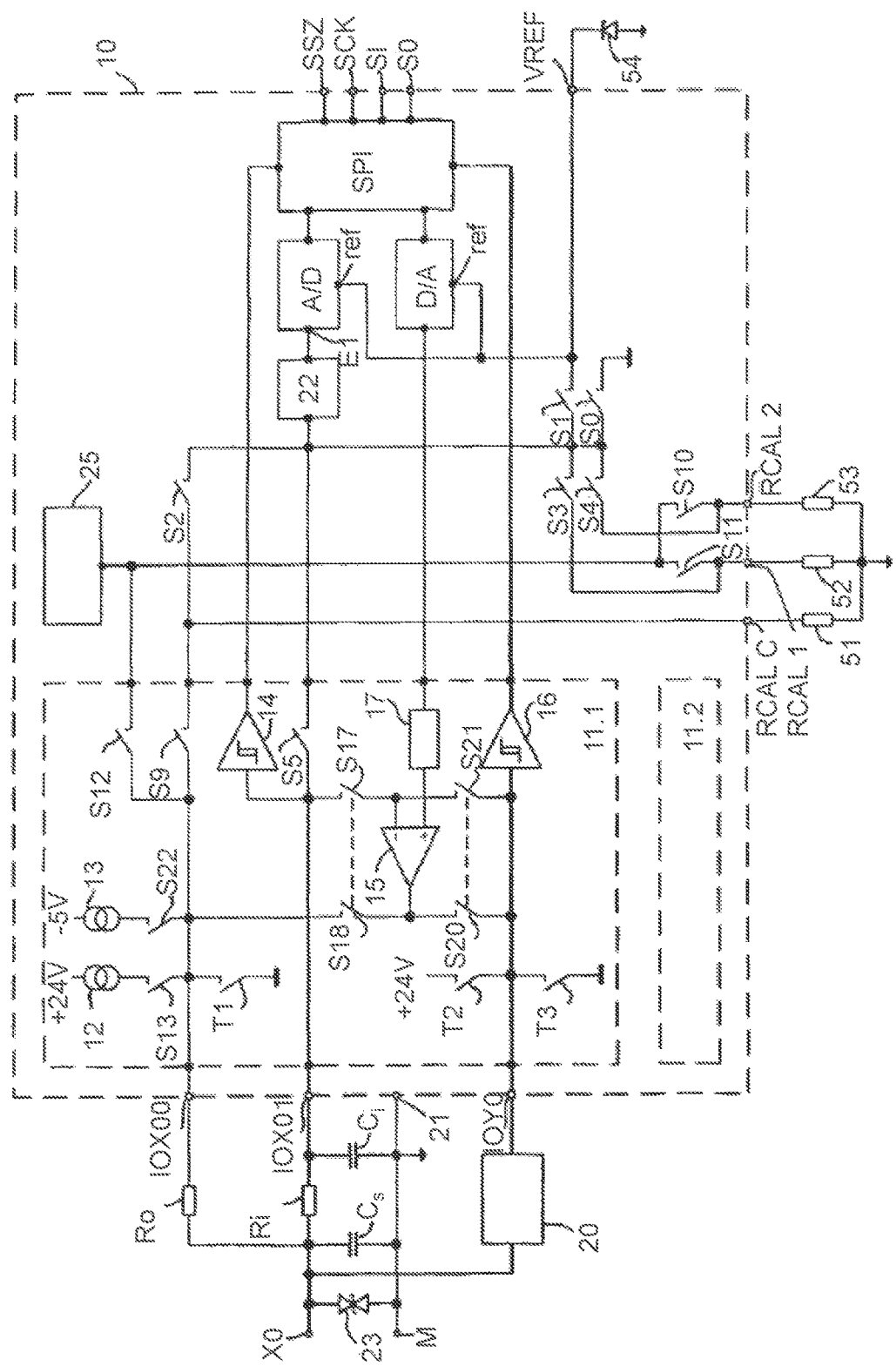
FIG. 2 shows a universal input/output circuit.

FIG. 2 shows a block diagram of the interface component 10 and also an advantageous external circuitry of the interface component 10. For reasons of clarity, FIG. 2 focuses on those function blocks of the interface component 10 which are essential for understanding the disclosure.

The interface component 10 has several identically structured channels. For the sake of simplicity, only a first channel 11.1 is represented in detail and framed in dashed lines. In addition, a second channel 11.2 is represented by another dashed-line frame. Typically, the interface component 10 provides four, eight, sixteen, thirty-two, or sixty-four channels.

The channel 10 has a first power source 12, a second power source 13, a sample-and-hold element 17, and an output amplifier 15. The power source 12 preferably provides 6 V, 12 V, 24 V, or 48 V. The power source 13 preferably provides −5 V, −10 V, −15 V, or −20 V. The power sources 12 and/or 13 advantageously provide direct current and/or direct voltage. The input of the amplifier 15 connects to the sample-and-hold element 17. Channel 10 further provides a first comparator 14, a second comparator 16 and a part configurable circuit including several switches Sxx and Tx.

The non-inverting input channel of the output amplifier 15 connects to the sample-and-hold element 17. The inverting input channel of the output amplifier 15 connects via switches S17 and S18 to the output channel of the amplifier 15. With the switches S17 and S18 closed, this part of channel 11.1 becomes a unity gain amplifier.

The interface component 10 includes at least a first connection point IOX01 and a second connection point IOX00 per channel 11.1 and 11.2, respectively. The first connection point IOX01 connects to a first (ohmic) resistor Ri. The second connection point IOX00 connects to a second (ohmic) resistor Ro.

In other words, the circuit arrangement of the instant disclosure comprises a first resistor Ri and a second resistor Ro and at least two terminals X0, M for connecting field devices 7, and the interface module 10 comprises a second connection point IOX00, and the terminal X0 connects via the first resistor Ri to the first connection point IOX01, and the terminal X0 connects via a second resistor Ro to the second connection point IOX00.

In an advantageous embodiment, a voltage-to-current converter 20 is also provided outside the interface component per channel 11.1 and 11.2, respectively. The voltage-to-current converter 20 may also be provided as part of each channel 11.1 and 11.2, respectively. The voltage-to-current converter 20 connects on the input side to a third connection point IOY0 of the corresponding channel 11.1. On the output side the voltage-to-current converter 20 connects to the first terminal X0 allocated to the corresponding channel 11.1.

The interface component 10 also includes at least a fourth connection point 21 for the signal reference point. The fourth connection point 21 connects to the terminal M.

The two (ohmic) resistors Ri and Ro and also the voltage-to-current converter 20 are typically not integrated in the interface component 10. The terminal X0 allocated to the channel 11.1 connects to the first connection point IOX01 via the first (ohmic) resistor Ri. The terminal X0 connects to the second connection point IOX00 of the channel 11.1 via the second (ohmic) resistor Ro. In a particular embodiment, at least one of the resistors Ri and Ro is non-reactive or substantially non-reactive. Preferably, the two resistors Ri and Ro are non-reactive or substantially non-reactive. In a special embodiment, at least one of the resistors Ri and Ro is ohmic or substantially ohmic. Ideally, the two resistors Ri and Ro are both ohmic or substantially ohmic.

In other words, the circuit arrangement of the instant disclosure comprises a first resistor Ri and a second resistor Ro, and the interface module 10 comprises a second connection point IOX00 and the amplifier 15 comprises an inverting input channel and an output channel, and the switching network S17 is configured to connect the inverting input channel of the amplifier 15 to the first connection point IOX01, and wherein the switching network S18 is configured to connect the output channel of the amplifier 15 to the second connection point IOX00, and wherein the first resistor Ri and the second resistor Ro in series electrically connect the second connection point IOX00 to the first connection point IOX01, such that the output channel of the amplifier 15 can be led to the inverting input channel of the amplifier 15 via the second connection point IOX00 and via the second resistor Ro and via the first resistor Ri and via the first connection point IOX01.

In particular, the circuit arrangement of the instant disclosure provides a switching network S17, S18 and a first resistor Ri and a second resistor Ro. These are configured to lead the output channel of the amplifier 15 to the inverting input channel of the amplifier 15, such that the amplifier 15 becomes a unity gain amplifier.

The first connection point IOX01 is led via controllable switches Sxx of the configurable circuit to the input E1 of an analog-to-digital converter A/D. Advantageously, the circuit also provides a program-controlled scaling apparatus 22 in between the analog-to-digital converter A/D and the first connection point IOX01. In a preferred variant, the program-controlled scaling apparatus 22 is a pre-amplifier. The skilled person understands that the program-controlled scaling apparatus 22 may also be an impedance converter.

In other words, the instant disclosure teaches a circuit arrangement, wherein the interface module comprises at least one program-controlled scaling unit 22 with an input channel and with an output channel, and wherein the output channel of the at least one program-controlled scaling unit 22 connects to the input channel of the analog-to-digital converter A/D, and wherein the input channel of the at least one program-controlled scaling unit 22 connects to the switch.

The second connection point IOX00 may connect via controllable switches Sxx of the configurable circuit to a power source 12 and/or 13 of the interface component 10.

A semiconductor overvoltage protection device 23 is ideally disposed between the terminal X0 and the terminal M. The semiconductor overvoltage protection device 23 is advantageously not integrated in the interface component 10. In a preferred embodiment, the semiconductor protection device 23 is matched to inadmissibly high voltages or interference voltage peaks.

If required, a capacitor Cs also connects between the terminal X0 and the terminal M provided for the signal reference point. The capacitor Cs is advantageously not integrated in the interface component 10. If required, a further capacitor Ci is connected between the first connection point IOX01 and the terminal M. The capacitor Ci is advantageously also not integrated in the interface component 10.

In other words, the circuit arrangement of the instant disclosure provides at least one electric component that connects between the at least two terminals X0, M of the circuit arrangement and the at least one electric component includes at least one of the following a capacitor Cs, Ci and/or a surge arrester 23 and the at least one element is either implemented in the interface module 10 or outside the interface module 10.

The values of the components arranged in the modules outside the interface component 10 are to be matched to one another. The first (ohmic) resistor Ri and the second (ohmic) resistor Ro can then assume protective functions for the interface component 10. The first and the second (ohmic) resistors Ri and Ro ideally assume their protective functions without adversely affecting the necessary accuracy of the signal recording. The first and the second (ohmic) resistors Ri and Ro preferably assume their protective functions without adversely affecting signal generation by the interface component 10.

The second (ohmic) resistance Ro should not be less than roughly 390 ohms. In a case of incorrect wiring with 24 V alternating voltage the interface component 10 and the second resistor Ro may otherwise suffer damage.

In as much as the complete configurability of the interface component 10 is to be utilized, the second (ohmic) resistor Ro should not exceed 390 Ohms. This limit is a result of a maximum permissible load of roughly 500 ohms for a current input when the measuring resistor 51 is 47 ohms. The measuring resistor 51 introduces a limit for the second (ohmic) resistor Ro, since the analog-to-digital converter A/D records the voltage via the measuring resistor 51. In a configuration as a current input, a current flows through the second (ohmic) resistance Ro, via the switch S9 and through the measuring resistor 51.

In as much as the configurability of the first terminal X0 as a current input is dispensed with, the second resistance (ohmic) Ro can also be chosen to be larger. The maximum value is then roughly 1500 Ohms. Conditions which obtain when the first terminal X0 is configured as a voltage output have a limiting effect. At maximum load, the voltage drop over the second (ohmic) resistance Ro needs be great enough for the whole range to be able to be controlled. The whole range is, by of non-limiting example, 0 V to 10 V. Also, the stability at maximum capacitive load, typically at 230 nF, should be guaranteed. Too great a second (ohmic) resistance Ro would impair stability behaviour.

The first (ohmic) resistance Ri should be as large as possible such as to minimise currents in the case of incorrect wiring. Input leakage currents flowing in the first connection point IOX01 should preferably not generate a noticeable voltage drop over the first (ohmic) resistor Ri.

The semiconductor overvoltage protection device 23, the capacitor Cs and the further capacitor Ci can be used in order to achieve electromagnetic compatibility of the terminal X0. The threshold voltage of the semiconductor overvoltage protection device 23 must be at least 42 V. This threshold voltage corresponds to a peak value of an incorrectly wired 24 V alternating current voltage leading line. The instant example accounts for an overvoltage of 20%.

The capacity of the capacitor Cs should not exceed the maximum permissible capacitive load for an active sensor with voltage output. A common value of maximum permissible capacitive load is 20 nF.

The time constant Ri·Ci formed by the first ohmic resistor Ri and the further capacitor Ci influences stability of the first terminal X0 configured as a voltage output. The values of the first (ohmic) resistor Ri and of the second capacitor Ci are to be chosen such that the time constant does not exceed the value of 1 microsecond. The voltage output may otherwise become unstable.

As for the following numerical values, it is assumed that the highest voltage value that is to be expected due to incorrect wiring and against which the interface component 10 is to be protected is 24 V+20% alternating current voltage. Also, the components arranged outside the interface component 10 are preferably arranged using the surface-mounted device technique. The interface component is to be housed in a customary plastic housing.

The configurable circuit of interface component 10 is built up from numerous switches Sxx and Tx. These switches are ideally controllable by the microcomputer 8 via suitable commands. In other words, the analog-to-digital converter A/D and/or the digital-to-analog converter D/A and/or the power (current) source 25 can be connected to connection points IOX00, IOX01, IOY0, RCAL 1, RCAL 2, RCAL C, 21 of the interface module 10. Preferably, the analog-to-digital converter A/D and/or the digital-to-analog converter D/A and/or the power (current) source 25 can automatically connect to connection points IOX00, IOX01, IOY0, RCAL 1, RCAL 2, RCAL C, 21 of the interface module 10.

In other words, the circuit arrangement of the instant disclosure provides a current source 25, and the switching network S12 is configured to connect the current source 25 to the second connection point IOX00.

In other words, the instant disclosure teaches a circuit arrangement wherein the circuit arrangement comprises a microcomputer 8 and wherein the microcomputer 8 connects to the interface module 10 and wherein the microcomputer 8 is able to configure the (switches of the) switching network Sxx, Tx via suitable commands.

The configurable circuit comprises on the one hand the part configurable circuits allocated to the individual channels 11.1 and 11.2. The configurable circuit comprises on the other hand the further part configurable circuit which serves to operate all the channels 11 jointly.

For the digital data communication between the interface component 10 and the microprocessor 8 (FIG. 1), the interface component 10 includes, by way of example, a (standardized) serial-peripheral interface SPI. The number of necessary connection points of the interface component 10 can be minimized through the serial-peripheral interface.

The digital-to-analog converter D/A and the analog-to-digital converter A/D both connect to the serial-peripheral interface SPI.

In the circuitry described above and represented on FIG. 2, the first terminal X0 is on the one hand led via the first (ohmic) resistor Ri to the first connection point IOX01. The first terminal X0 is on the other hand led via the second ohmic resistor Ro to the second connection point IOX00. The circuitry described above permits, given appropriate dimensioning, a secure and highly accurate operation of the most varied field devices. In particular, a large part of the field devices employed in building automation is able to operate with the circuitry.

For calibration of signals at the first terminal X0, (ohmic) calibrating resistors are provided. The (ohmic) calibrating resistors are used via controlled switches Sxx of the configurable circuit. They are advantageously arranged outside the interface component 10 in the input/output circuits 1 and/or 2.

In an advantageous embodiment of the interface component 10, the interface component 10 includes a fifth connection point RCAL C, a sixth connection point RCAL 1, a seventh connection point RCAL 2 and an eighth connection point VREF. The fifth connection point RCAL C connects to a measuring resistor 51. The sixth connection point RCAL 1 connects to a first calibrating resistor 52. The seventh connection point RCAL 2 connects to a second calibrating resistor 53. An eighth connection point VREF connects to a voltage reference element 54.

Calibration, linearization, and scaling of an analog signal is (essentially) controlled by the microcomputer 8. To that end, the microcontroller 8 connects to the configurable circuit of the interface component 10. The microcomputer 8 also carries out the necessary calculations. The characteristic of a field device such as a non-linearity is advantageously compensated with the help of the microcomputer 8.

The microcomputer 8 is also able to be implemented by an arrangement with a microprocessor together with memory and communication components. In principle, the microcomputer 8 and the interface component 10 could also be realized in a single sub-assembly. If required, the interface component 10 comes with a run-off control. The run-off control is not represented on the drawing. The run-off control is for the interpretation of certain instructions transferred by the microcomputer 8 to the interface component 10.

It is envisaged that the microcontroller 8 runs an operating system. The operating system may, for instance, be an Android® operating system, a Windows® operating system, or a Linux® operating system such as Meego®. The operating system may be a system specifically tailored for embedded systems and/or for controllers for building automation systems. The operating system may also be general-purpose.

FIG. 3 shows various sequences of signals over time. The uppermost sequence as depicted on FIG. 3 is sequence of commands issued by the serial-peripheral interface SPI. The second sequence from the top of FIG. 3 depicts the activity of the analog-to-digital converter A/D. The third signal sequence from the top represents the activity of the digital-to-analog converter D/A.

The fourth and the fifth plots are sequences of switches S12 and S5 as well as sequences of switches S17 and S18. The lowermost plot of FIG. 3 shows voltage between the terminals X0 and M.

To avoid issues due to capacitor soakage, the serial-peripheral interface instructs the analog-to-digital converter to start. Also, the switches S12 and S5 close. As the switch S12 closes, the programmable power source 25 drives a current through any element connected between terminals X0 and M. The same voltage drop between contacts X0 and M is transferred via the resistor Ri, via the closed switch S5, and via the (optional) program-controlled scaling apparatus 22 to the input channel of the analog-to-digital converter A/D.

Shortly after closing switches S5 and S12, the switches S17 and S18 open. The unity gain amplifier 15 thereby disconnects from the output terminal X0. The voltage at the output terminal X0 is thus no longer set to the voltage at the non-inverting input of the amplifier 15. With open contacts S17 and S18, the voltage at the output terminal X0 assumes a value that corresponds to the current through any element connecting X0 to M. The voltage between contacts X0 and M may change as shown on the lowermost plot of FIG. 3.

The switches S5 and S12 remain closed and the switches S17 and S18 remain open while the analog-to-digital converter records a voltage. The phase of recording the voltage drop between terminals X0 and M is indicated on FIG. 3 by reference numeral 62. This phase needs to last long enough for the analog-to-digital converter to deliver at its output a proper digital representation of the voltage drop between X0 and M. The digital representation of the voltage drop between X0 and M may then be stored in a register. The register may, by way of non-limiting example, be provided by the microprocessor 8. The register may also be part of the analog-to-digital converter. In a particular embodiment, the analog-to-digital converter directly writes its output to an input register of the digital-to-analog converter D/A.

Once the analog-to-digital converter A/D has recorded and has stored the result of the voltage measurement, the switches S17 and S18 close. By closing the switches S17 and S18, the voltage between terminals X0 and M is again set to the voltage at the non-inverting input of amplifier 15. The switches S12 and S5 then open in order to interrupt the current supplied by the programmable power source 25.

In a preferred embodiment, the microprocessor 8 now reads a digital representation of the voltage measured by the analog-to-digital converter A/D. The corresponding step is shown on FIG. 3 as step 63. Next, the microprocessor 8 writes the digital representation of the voltage measurement to the input register of the digital-to-analog converter D/A. FIG. 3 shows the corresponding step as step 64.

In other words, the circuit arrangement of the instant disclosure provides the register configured to be written by the analog-to-digital converter A/D and configured to be read by the digital-to-analog converter D/A and/or wherein said register is part of the interface module 10.

In a particular embodiment, the register is part of the analog-to-digital converter A/D and the input port of the digital-to-analog converter D/A connects to the register of the analog-to-digital converter A/D such that the digital-to-analog converter D/A can read said digital representation from said register.

According to an alternate embodiment, the register is part of the digital-to-analog converter D/A and the output port of the analog-to-digital converter A/D connects to the register of the digital-to-analog converter D/A such that the analog-to-digital converter A/D can write said digital representation to said register.

In an embodiment, the circuit arrangement provides a bus connecting the output port of the analog-to-digital converter A/D to the input port of the digital-to-analog converter A/D and/or said bus is part of the interface module 10.

According to a particular embodiment said bus is configured to establish a unidirectional data connection from the output port of the analog-to-digital converter A/D to the input port of the digital-to-analog converter D/A.

Alternatively, said bus is configured to establish a bidirectional data connection between the output port of the analog-to-digital converter A/D and the input port of the digital-to-analog converter D/A.

The microprocessor 8 advantageously reads values from the analog-to-digital converter A/D and/or writes values to the digital-to-analog converter D/A through the serial-peripheral interface SPI.

It is also envisaged that the microprocessor 8 communicates directly with the input/output registers of the analog-to-digital converter A/D and/or of the digital-to-analog converter D/A. That is, the microprocessor 8 is able to read (directly) from the analog-to-digital converter A/D and/or is able to write (directly) to the digital-to-analog converter D/A.

Upon completion of the transfer of the voltage representation from the analog-to-digital converter A/D to the digital-to-analog converter D/A, the latter converter D/A generates an analog voltage. FIG. 3 refers to the corresponding step as reference numeral 65. The amplitude of the voltage at the output of the digital-to-analog converter D/A is the same or substantially the same as the previously measured voltage. The output of the digital-to-analog converter is forwarded to the sample-and-hold element 17. According to an alternate embodiment, the output of the digital-to-analog converter is sufficiently stable. The output is directly applied to the non-inverting input of the amplifier 15.

With the (single-throw) switches S17 and S18 closed, the output voltage of amplifier 15 is fed via the second connection point IOX00 and via the second (ohmic) resistor Ro to the terminal X0. The same voltage is led via the first (ohmic) resistor Ri and via the switch S17 to the inverting input channel of the amplifier 15. In other words, the output voltage of the amplifier 15 is led back to its inverting input. In this particular configuration the (operational) amplifier 15 becomes a unity gain amplifier 15. That is, the amplifier 15 supplies constant or essentially constant voltage to the first connection point IOX01 and to the terminal X0.

It is envisaged that the circuit of the instant disclosure cyclically determines terminal voltage and applies the same voltage. The circuit of the instant disclosure thus continuously determines the voltage at terminal X0 and applies the (substantially) same voltage to the same terminal X0. By cyclic repetitions of the above procedure, adverse effects due to capacitor soakage are minimized. It is envisaged that the microcomputer 8 and the serial-peripheral interface SPI are involved in the cyclic repetitions.

Prior to determining the resistance of an element connected between the terminals X0 and M, a number of calibration steps are carried out. A switch S11 closes in order that the programmable source 25 connects to the first calibrating resistor 52. Another switch S3 closes such that the voltage applied to the calibrating resistor 52 is led via the (optional) program-controlled scaling apparatus 22 to the analog-to-digital converter A/D. The analog-to-digital converter A/D then outputs a digital representation of the voltage drop over the calibrating resistor 52.

In other words, the instant disclosure teaches a circuit arrangement wherein the circuit arrangement comprises at least one calibration resistor 52 and wherein the switching network Sxx, Tx provides a fifth switch S11 and wherein the switch S11 is configured to connect the calibration resistor 52 to the current source 25.

The resistance of an element connected between the terminals X0 and M is then determined. With the switch S12 closed, the programmable power (current) source 25 drives a current through a resistive element connected between the terminals X0 and M. The terminal M serves as the signal reference point and preferably connects to earth. An electric current thus flows from the source 25 to the terminal M through the switch S12, through the second (ohmic) resistor Ro, and through a resistive element connected between the terminals X0 and M.

With the switch S5 closed, the voltage drop over the resistive element is led from the terminal X0 over the first (ohmic) resistor Ri, over the switch S5 and over the program-controlled scaling apparatus 22 to the analog-to-digital converter A/D.

Parts of the circuits or parts of a method according to the present disclosure may be embodied in hardware, in a software module executed by a processor, or by a cloud computer, or by a combination thereof. The software may include a firmware, a hardware driver run in the operating system, or an application program. Thus, the disclosure also relates to a computer program product for performing the operations presented herein. If implemented in software, the functions described may be stored as one or more instructions on a computer-readable medium. Some examples of storage media that may be used include random access memory (RAM), magnetic RAM, read only memory (ROM), flash memory, EPROM memory, EEPROM memory, registers, a hard disk, a removable disk, other optical disks, a Millipede® device, or any available media that can be accessed by a computer or any other IT equipment and appliance.

It should be understood that the foregoing relates only to certain embodiments of the invention and that numerous changes may be made therein without departing the scope of the invention as defined by the following claims. It should also be understood that the invention is not restricted to the illustrated embodiments and that various modifications can be made within the scope of the following claims.

REFERENCE NUMERALS

1, 2 input/output circuits
3 bus system
4 control and regulation device
5 bus system
6 superordinated module
7 field device
7.1 passive sensor
7.2 active sensor
7.3 potential-free switch
7.4 voltage-controlled servo element
7.5 current-controlled servo element (with a position reporter)
7.6 further field device
8 microcomputer
10 interface component
11.1, 11.2 channels
12, 13 power sources
14 first comparator
15 output amplifier
16 second comparator
17 sample-and-hold element
20 voltage-to-current converter
21 fourth connection point
22 program-controlled scaling apparatus
23 semiconductor overvoltage protection device 25 programmable power (current) source
51 measuring resistor
52 first (ohmic) calibrating resistor
53 second (ohmic) calibrating resistor
54 reference element
61 instruction to start the A/D
62 A/D recording the voltage drop between terminals X0 and M
63 A/D read
64 D/A write
65 D/A conversion
A/D analog-to-digital converter
Ci capacitor between IOX01 and M
Cs capacitor between X0 and M
D/A digital-to-analog converter
IOX00 second connection point
IOX01 first connection point
IOY0 third connection point
M terminal (for the signal reference point)
RCAL 1 fifth connection point
RCAL C sixth connection point
RCAL 2 seventh connection point
VREF eighth connection point
Ri first (ohmic) resistor
Ro second (ohmic) resistor
SPI serial-peripheral interface
Sxx (controlled) switches S0 . . . S22
Tx switches T1 . . . T3
Sxx, Tx switching network
X0, X1, X2, X3 terminals for the connection of field devices

What is claimed is:

1. A circuit arrangement for universal input/output, the circuit arrangement comprising:
   at least one interface module having an analog-to-digital converter with an input channel and with an output port,
   a digital-to-analog converter with an input port and with an output channel,
   a first connection point,
   an amplifier with a non-inverting input channel, and
   a switching network with a plurality of switches,
   wherein the output channel of the digital-to-analog converter connects either directly or via a sample-and-hold element to the non-inverting input channel of the amplifier,
   wherein the switching network is configured to connect the analog-to-digital converter either directly or via a program-controlled scaling apparatus to the first connection point,
   wherein the analog-to-digital converter is configured such that upon connection of the analog-to-digital converter to the first connection point, the analog-to-digital converter converts a first analog voltage at the first connection point into a digital representation of the first analog voltage and outputs the digital representation at its output port,
   wherein the circuit arrangement is configured to transfer the digital representation from the output port of the analog-to-digital converter to the input port of the digital-to-analog converter,
   wherein to facilitate the transfer the circuit arrangement comprises
      a bus connecting the output port of the analog-to-digital converter to the input port of the digital-to-analog converter,
   wherein the digital-to-analog converter is configured such that upon completion of the transfer, the digital-to-analog converter converts the digital representation at its input port into a second analog voltage, such that the second analog voltage is the same or substantially the same as the first analog voltage.

2. The circuit arrangement of claim 1, wherein:
   the circuit arrangement comprises a register configured to be written by the analog-to-digital converter and configured to be read by the digital-to-analog converter, and
   the register is part of the interface module.

3. The circuit arrangement of claim 2, wherein:
   the register is part of the analog-to-digital converter, and
   the input port of the digital-to-analog converter connects to the register of the analog-to-digital converter such that the digital-to-analog converter can read the digital representation from the register.

4. The circuit arrangement of claim 2, wherein:
   the register is part of the digital-to-analog converter, and
   the output port of the analog-to-digital converter connects to the register of the digital-to-analog converter such that the analog-to-digital converter can write the digital representation to the register.

5. The circuit arrangement of claim 1, wherein the bus is part of the interface module.

6. The circuit arrangement of claim 5, wherein the bus is configured to establish a unidirectional data connection from the output port of the analog-to-digital converter to the input port of the digital-to-analog converter.

7. The circuit arrangement of claim 5, wherein the bus is configured to establish a bidirectional data connection between the output port of the analog-to-digital converter and the input port of the digital-to-analog converter.

8. The circuit arrangement of claim 1, wherein the circuit arrangement provides a microcomputer configured to generate at least one of the following instructions:
   an instruction to the switching network to carry out switching operations,
   an instruction to the analog-to-digital converter to carry out conversion operations,
   an instruction to the digital-to-analog-converter to carry out conversion operations,
   an instruction to the analog-to-digital converter to write to a register,
   an instruction to the digital-to-analog-converter to read from a register, or
   an instruction to a current source.

9. The circuit arrangement of claim 8, wherein:
   the interface module further comprises a serial-peripheral interface and
   the microcomputer is configured to generate at least one of the following instructions:
   an instruction to switching network via the serial-peripheral interface,
   an instruction to the analog-to-digital converter via the serial-peripheral interface,
   an instruction to the digital-to-analog-converter via the serial-peripheral interface,
   an instruction to the analog-to-digital converter via the serial-peripheral interface, or
   an instruction to a current source via the serial-peripheral interface.

10. The circuit arrangement of claim 1, wherein:
    the circuit arrangement further comprises a first resistor and a second resistor,
    the interface module comprises a second connection point, and the amplifier comprises an inverting input channel and an output channel, and
wherein the switching network is configured to connect the inverting input channel of the amplifier to the first connection point, and
wherein the switching network is configured to connect the output channel of the amplifier to the second connection point, and
wherein the first resistor and the second resistor in series electrically connect the second connection point to the first connection point,
such that the output channel of the amplifier can be led to the inverting input channel of the amplifier via the second connection point and via the second resistor and via the first resistor and via the first connection point.

11. The circuit arrangement of claim 10, wherein the switching network and the first resistor and the second resistor are configured to lead the output channel of the amplifier to the inverting input channel of the amplifier, such that the amplifier becomes a unity gain amplifier.

12. The circuit arrangement of claim 11, wherein at least one terminal is configured for use as a signal reference point.

13. The circuit arrangement of claim 1, wherein:
the circuit arrangement comprises a first resistor and a second resistor and at least two terminals for connecting field devices,
the interface module comprises a second connection point,
the terminal connects via the first resistor to the first connection point, and
the terminal connects via a second resistor to the second connection point.

14. The circuit arrangement of claim 13, wherein:
at least one electric component connects between the at least two terminals of the circuit arrangement,
the at least one electric component includes at least one of a capacitor or a surge arrester, and
the at least one element is implemented either in the interface module or outside the interface module.

15. The circuit arrangement of claim 14, wherein:
the circuit arrangement further provides a current source, and
the switching network is configured to connect the current source to the second connection point.

16. A circuit arrangement for universal input/output, the circuit arrangement comprising:
at least one interface module having an analog-to-digital converter with an input channel and with an output port,
a digital-to-analog converter with an input port and with an output channel,
a first connection point,
an amplifier with a non-inverting input channel, and
a switching network with a plurality of switches,
wherein the output channel of the digital-to-analog converter connects either directly or via a sample-and-hold element to the non-inverting input channel of the amplifier,
wherein the switching network is configured to connect the analog-to-digital converter either directly or via a program-controlled scaling apparatus to the first connection point,
wherein the analog-to-digital converter is configured such that upon connection of the analog-to-digital converter to the first connection point, the analog-to-digital converter converts a first analog voltage at the first connection point into a digital representation of the first analog voltage and outputs the digital representation at its output port,
wherein the circuit arrangement is configured to transfer the digital representation from the output port of the analog-to-digital converter to the input port of the digital-to-analog converter,
wherein to facilitate the transfer the circuit arrangement comprises at least one of:
a bus connecting the output port of the analog-to-digital converter to the input port of the digital-to-analog converter, or
a register configured to be written by the analog-to-digital converter and configured to be read by the digital-to-analog converter,
wherein the digital-to-analog converter is configured such that upon completion of the transfer, the digital-to-analog converter converts the digital representation at its input port into a second analog voltage, wherein the second analog voltage is the same as the first analog voltage.

* * * * *